United States Patent
Duval et al.

(10) Patent No.: US 6,826,227 B1
(45) Date of Patent: Nov. 30, 2004

(54) METHOD INTENDED FOR LOSS-FREE COMPRESSION OF SIGNALS OF WIDE DYNAMIC RANGE WITH A VIEW TO THEIR TRANSMISSION

(75) Inventors: Laurent Duval, Nanterre (FR); Van Bui Tran, Massy (FR)

(73) Assignee: Institut Francais du Petrole, Rueil-Malmaison cedex (FR)

( * ) Notice: Subject to any disclaimer, the term of this patent is extended or adjusted under 35 U.S.C. 154(b) by 0 days.

(21) Appl. No.: 09/360,162

(22) Filed: Jul. 26, 1999

(30) Foreign Application Priority Data

Jul. 29, 1998 (FR) .......................................... 98 09738

(51) Int. Cl.⁷ ................................................ H04B 1/66
(52) U.S. Cl. ...................................... 375/240; 375/295
(58) Field of Search ........................... 375/240–240.29, 375/242, 243, 244, 253, 295; 348/384.1–440; 382/232–253; 341/56, 59, 65, 67, 76, 77; 704/500–504; 367/21, 36, 37, 74, 76; 702/14–18

(56) References Cited

U.S. PATENT DOCUMENTS

| | | | |
|---|---|---|---|
| 4,509,150 A | * 4/1985 | Davis | 367/776 |
| 4,544,919 A | * 10/1985 | Gerson | 341/75 |
| 4,974,235 A | * 11/1990 | Sasaki et al. | 375/245 |
| 5,933,790 A | * 8/1999 | Jeffryes | 702/17 |
| 6,061,299 A | * 5/2000 | Grouffal et al. | 367/49 |
| 6,285,796 B1 | * 9/2001 | Acharya et al. | 382/246 |

* cited by examiner

*Primary Examiner*—Chieh M. Fan
(74) *Attorney, Agent, or Firm*—Antonelli, Terry, Stout & Kraus, LLP

(57) ABSTRACT

A method for loss-free compression of signals of wide dynamic range, such as seismic signals, includes sampling the signals, digitizing the signals, and using a predictive coding technique with transmission of prediction coefficients and of prediction residues. The method determines at least one amplitude range depending on a threshold value (S), that contains most of the prediction residues, codes the prediction residues by binary words having a number n of bits sufficient for coding of the range, and codes the prediction residues whose amplitude are outside this range, by binary words having a fixed number of bits greater than n.

32 Claims, 3 Drawing Sheets

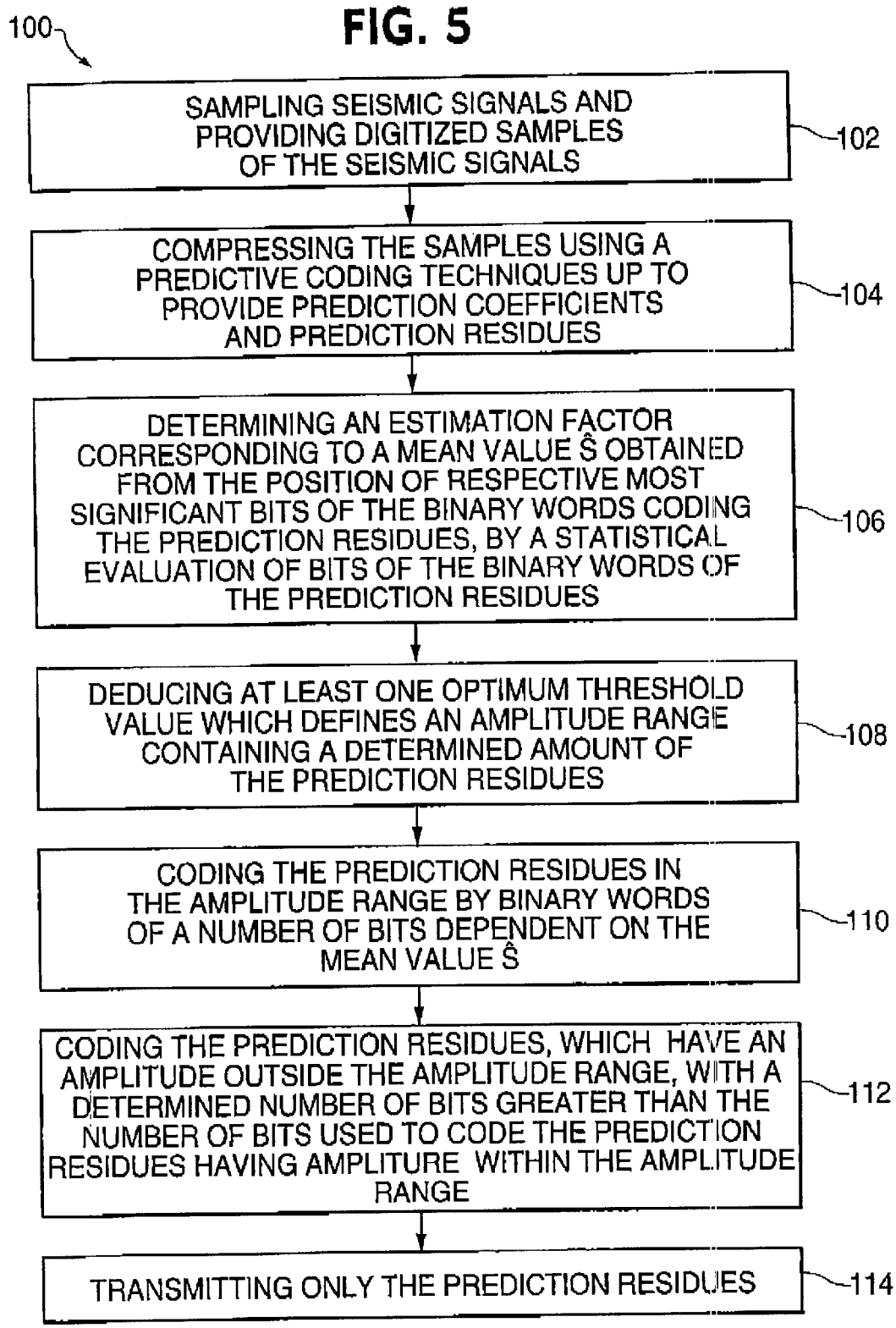

METHOD INTENDED FOR LOSS-FREE COMPRESSION OF SIGNALS OF WIDE DYNAMIC RANGE WITH A VIEW TO THEIR TRANSMISSION

BACKGROUND OF THE INVENTION

1. Field of the Invention

The present invention relates to a data transmission method using loss-free compression techniques, in order to optimize the use of available transmission channels.

2. Description of the Prior Art

Various seismic data transmission systems are used to connect local acquisition units to a central station, either directly or via intermediate stations provided with complex local unit concentration or control functions. Links can be provided by cables, radio links, one or more relays, or by combining cable links and radio links as described, for example, in French Patents 2,720,518, 2,696,839, 2,608,780, 2,599,533, 2,538,561, 2,511,772 or 2,627,652 filed by the assignee.

French Patent 2,608,780, filed by the assignee, notably discloses use of seismic acquisition boxes provided with two transmission channels, one with a relatively high transmission rate, the other with a passband that can be relatively narrow according to the local availability of transmission frequencies, more readily available within the scope of the radio communication emission regulations in force. The seismic data collected during successive cycles are stored in a mass storage in each box and intermittently transferred to a central control and recording station. In order to enable the operator in the central station to check that data acquisition by each acquisition box is normal, partial data transmission is performed, which is suitable with a transmission channel with a relatively narrow passband.

French Patents 2,692,384 and 2,757,641 and French Patent Application 97/09,547, all filed by the assignee, describe the use of seismic acquisition boxes provided with a specialized processor for signal processing, that perform many geophone and acquisition system element controls, seismic trace preprocessing previously performed in the central station after transmission, and apply compression algorithms to the seismic data to be transmitted. All these preprocessing operations considerably decrease the volume of data to be transmitted to the central station.

The current trend, notably within the scope of 3D seismic exploration methods, is to spread out over a zone to be explored, onshore, offshore or in coastal areas, often over several kilometers, hundreds or even thousands of seismic receivers. The volume of data to be collected and transmitted continually increases. In order to prevent transmission problems from acting as a break on the evolution of seismic systems, the trend is to use data compression processes selected to be compatible with geophysicists' specific demands.

Compression of seismic data can provide both an appreciable saving in space for the mass storage modules in the local acquisition boxes and/or the local control and concentration stations, and a considerable saving in transmission time.

The known data compression methods can be classified into two families, a) compression methods without information loss and b) methods leading to an information loss so the restored data loses a large part of its precision.

In geophysics, it is essential that the losses due to compression remain as low as possible because the most pertinent information often has a very low amplitude and can be isolated from the background noise only by digital processing on several traces. Possible precision losses are tolerable only in certain particular cases. For example, the information transmitted is only used for controlling the working order of the equipment and for displaying the "pattern" of the sampled traces.

Examples of methods of the first family are the methods which eliminate the redundance of the data or the methods referred to as dictionary methods where each word is replaced by its index in a reference table, which are all the more interesting since the files to be compressed contain many redundancies, the methods referred to as RLE (Run-Length Encoding) methods, statistical type coding methods where data is replaced by a code having the same significance but occupying less room and arithmetic coding type methods which represent a variable number of data by a constant number of bits.

A known compression technique referred to as LPC (Linear Predictive Coding) method is well suited for compression of acoustic or seismic waves. It essentially replaces a signal sample s(t) by a prediction made from p previous samples, assuming that the signal is stationary. Instead of transmitting a sample s(t), its prediction $\hat{S}(t)$ is transmitted, i.e. the prediction coefficients and the residues e(t), i.e. the difference between the real value and the prediction made at the time t, which allows finding the value $s(t)=\hat{S}(t)+e(t)$ after decompression. If the prediction is good, the residues are few and they occupy less room than the initial values s(t). The coefficients used for calculating $\hat{S}(t)$ are generally small in number and occupy little room in relation to s(t).

However, with this type of coding, it is conventional to store the successive trace samples in buffer memories of definite size and to calculate prediction coefficients that are used for all the samples of a single group. This type of convention is ill-suited to signals of wide dynamic range such as the signals emitted by impulsive sources (dynamite charges for example) and coding errors appear because the predictive coefficients selected are not really representative.

SUMMARY OF THE INVENTION

The method according to the invention performs loss-free compression of signals of wide dynamic range, such as seismic signals, for transmission.

The method according to the invention finds applications notably in the field of seismic prospecting where transfer of considerable data to a central station, such as a recording truck, is necessary. Signals are picked up by a large number of receivers such as geophones coupled with a geologic formation to be studied, in response to impact pulses emitted by a seismic source and reflected by the subsoil discontinuities. The signals picked up are collected by local acquisition units, sometimes spread out over a distance of kilometers, which collect the signals received by one or more receivers, to digitize the signals, to apply complex preprocessings thereto and to store the signals in a local memory before real-time or off-line transmission thereof to a collection station through a transmission channel such as a cable, an optical fiber, a radio channel, etc.

The method comprises sampling and digitizing the signals, and using a predictive coding technique.

The method comprises determining an amplitude range depending on at least one threshold value (S), that contains most of the prediction residues, coding the prediction residues by binary words having a number of bits sufficient for coding of the range and coding the prediction residues whose amplitude is outside the range, by binary words having a fixed number of bits greater than n, and transmitting only the prediction residues (the prediction coefficients are not transmitted but recalculated).

According to an embodiment, the method comprises determining an estimation factor (Ŝ) of an optimum threshold value corresponding to a mean value obtained from the position of the respective most significant bits of N prediction residues determined successively.

According to another embodiment, the method comprises determining amplitude ranges depending on distinct threshold values.

The method can also comprise separate coding of least significant and most significant bits of the signal samples.

According to a preferred embodiment, the method comprises determining prediction residues for each new signal sample.

The method according to the invention is advantageous with its two stages taken separately or preferably in combination
   a) determining the number of bits at most necessary for coding most of the errors allows obtaining a very high compression rate, even if the particular processing applied for coding the remaining atypical errors (few in number when the coding range is well selected) is taken into account;
   b) coding is here perfectly adaptive since the predictive coefficients are calculated on each sample, which guarantees result stability.

BRIEF DESCRIPTION OF THE DRAWINGS

Other features and advantages of the method according to the invention will be clear from reading the description hereafter of a non limitative realization example, with reference to the accompanying drawings wherein:

FIG. 5 is a flowchart of a method of loss-free transmission of seismic signals having a wide dynamic range.

DETAILED DESCRIPTION OF THE PREFERRED EMBODIMENTS

I) Adaptive Coding

Figure 1:
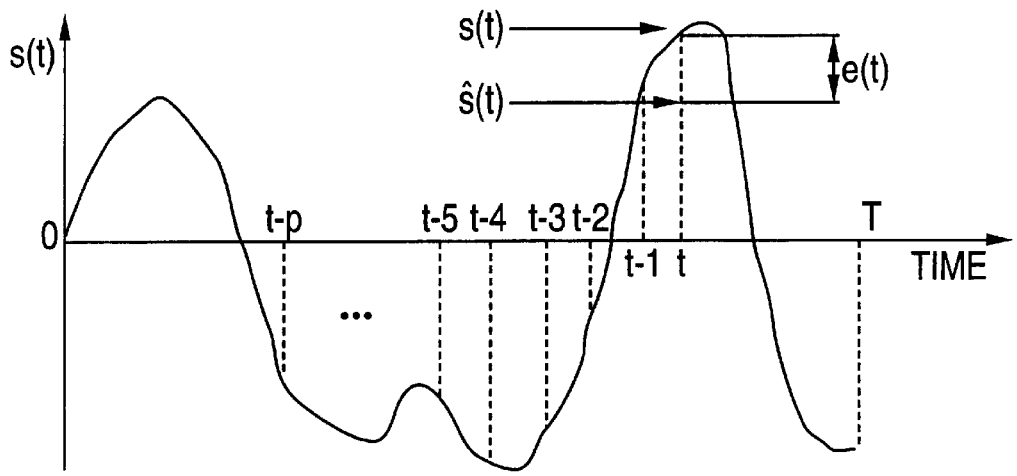
FIG. 1 illustrates the known statistical technique for predicting the value of samples of a signal, FIG. 2 diagrammatically shows operations of compression of a signal, FIG. 3 diagrammatically shows operations of symmetrical decompression of a signal.

The process according to the invention comprises applying to the data to be transmitted a loss-free type compression using the predictive technique referred to as LPC, where the amplitude s(t) of a signal sample at a time t (FIG. 1) is calculated by means of a prediction made from a number p of samples at the times (t−1), (t−2), (t−3), . . . (t−p), and the predicted value is calculated in accordance with the following relation:

$$\hat{s}(t) = \sum_{j=1}^{p} a_j \cdot s(t-j) \tag{1}$$

Figure 2:
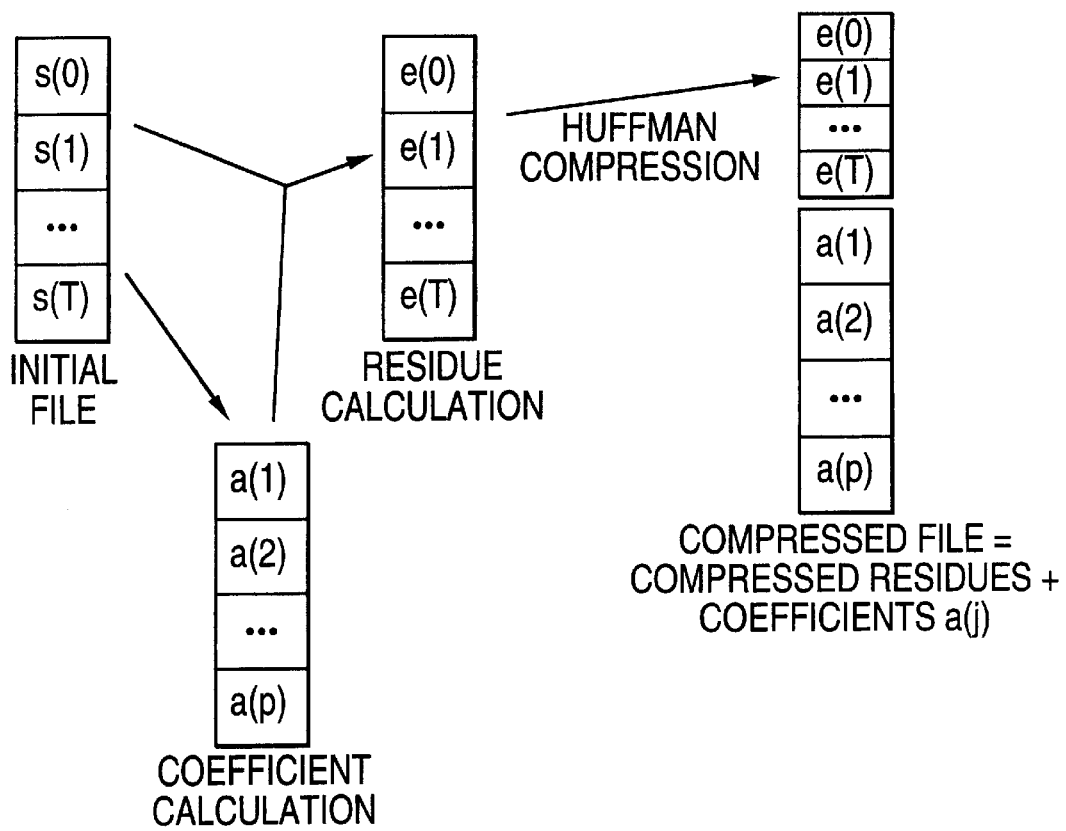

Instead of transmitting the sample, the prediction coefficients are calculated on line and the residues e(t), i.e. the difference calculated between the real value s(t) and the prediction Ŝ(t) made at the time t, are transmitted, which allows finding the value s(t)=Ŝ(t)+e(t) (FIG. 2).

At the time t, the values of s at past times have already been calculated, s(t−j) is therefore known for j ∈[1, p]. The values s(t−j) of Eq.(1) that are not known for t ∈[0,p−1] are replaced by the value 0. The difference between the calculated model and the real signal (referred to as prediction error or residue hereafter) is coded so as to reduce the average size allocated to each sample (in relation to the 24 initial bits) and to carry out a compression. If the prediction is good, the residues are few in number and the residues can be coded with binary words having a number of bits, at least on average, generally much smaller than that used for coding each sample s(t) (24 bits for example).

Figure 3:
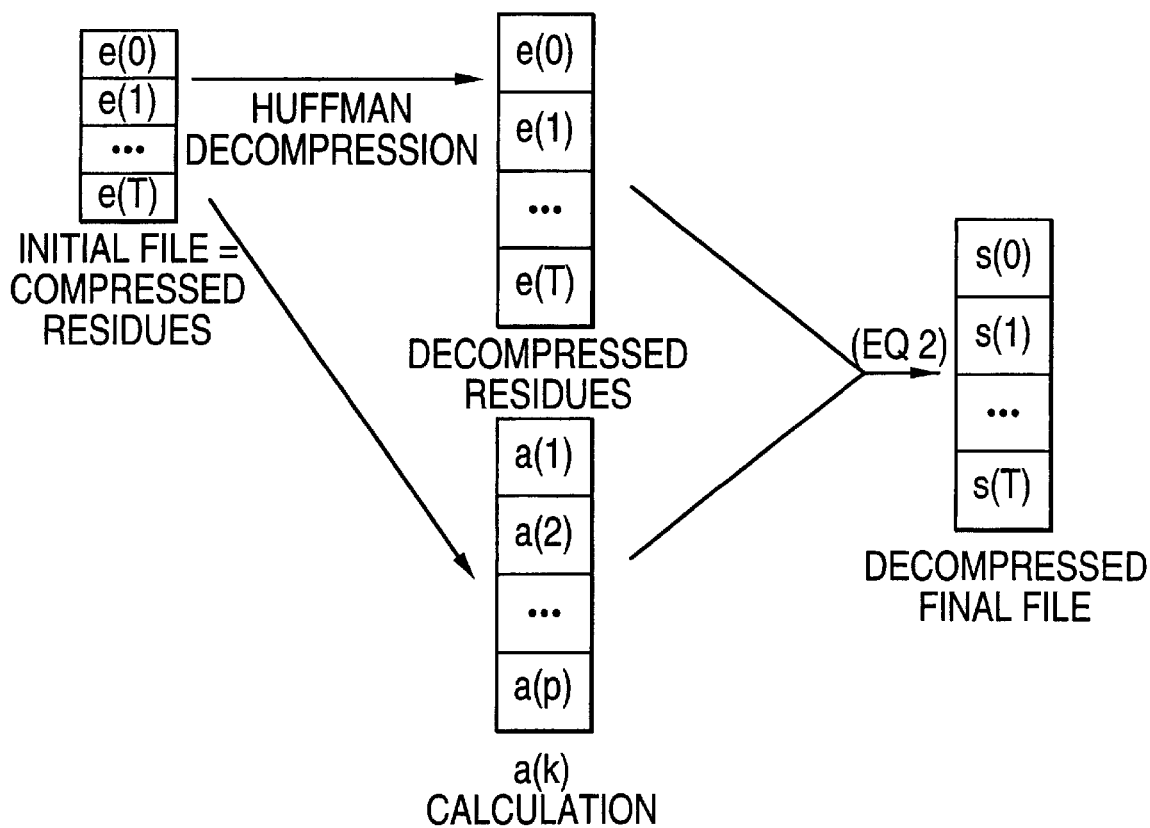

During the decompression stage (FIG. 3), the signal is restored according to the following formula:

$$s(t) = \sum_{j=1}^{p} a_j \cdot s(t-j) + e(t); \text{ with } t \in [0, T] \tag{2}$$

The compressed residues e(i) from the initial file are decompressed and the prediction coefficients a(k) are recalculated for each sample.

An adaptive prediction is preferably performed: the prediction coefficients $a_1, a_2, \ldots, a_p$ of the evaluation filter are recalculated for each new sample in order to take account of the often very wide dynamic range of the seismic signals.

The process according to the invention makes it possible to substantially reduce the size of the binary words used for coding the residues. A coding method with a single threshold allowing defining an amplitude range containing most of the prediction residues is described hereafter.

II) Residues Coding: Single-Threshold Method

Figure 4:
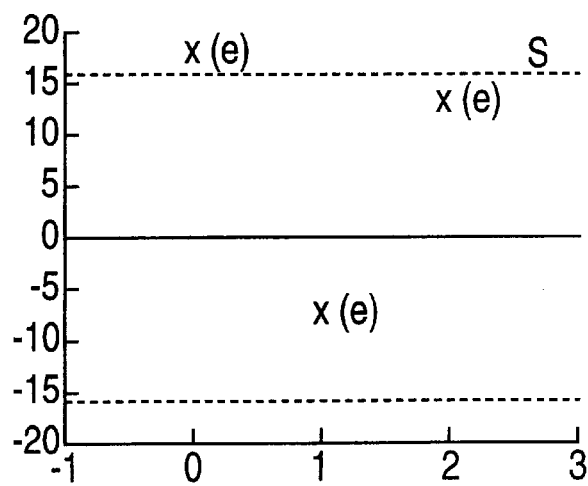
FIG. 4 shows, in the case of coding with a single threshold, an amplitude range S selected to contain most of the prediction residues.

If errors can be coded in absolute value on $N_{max}$ bits and that $N_{max}$<23, a gain is obtained by coding each error on $N_{max}$+1 bits, including the sign bit. In a case of considerable variations in the characteristics of the signal, prediction errors of very wide dynamic range can occur, but are not very frequent. One then tries to determine a threshold S (FIG. 4) such that, for most prediction errors, e lies within a symmetrical value range with $\pm 2^s$ ($-2^s$<e <$2^s$) as the bounds. The prediction errors or residues within the range can be coded on S+1 bits (including the sign bit). The compressed file contains two octets coding respectively $N_{max}$ and S, then Example: if $N_{max}=7$, $S=4$, $e_0=18$, $e_1=-7$ and $e_2=14$, the errors are slight on S+1 bits;

the significant errors on $N_{max}+1$ bits, preceded by a prefix code corresponding to:

$$-2^S(1\underbrace{0\ldots 0}_{S\ zeros}).$$

The compressed file will start with the following sequence:

$$\underbrace{00000111}_{N_{max}}\ \underbrace{00000100}_{S}\ \underbrace{10000}_{code}\ \underbrace{00010010}_{e_0}\ \underbrace{10111}_{e_1}\ \underbrace{01110}_{e_2}$$

Without simple modelling of the error distribution, a priori determination of the optimum value of S is difficult, and performances can be considerably lessened by a wrong choice of this value. Since all the possible values of S cannot be scanned, a good estimator of this value is sought. The estimator S selected is defined as follows: Nb(e) denotes the number of bits occupied by a positive integer e (not including the sign), or the position of its most significant bit. Conventionally, it is considered that Nb(0)=1.

$$Nb(e) = \begin{cases} 1 \text{ if } e = 0 \\ \lfloor \log_2(e) \rfloor + 1 \text{ if } e \geq 1 \end{cases}$$

($\lfloor\ \rfloor$ denotes the next lower integer).

$$\hat{S} = 2 + \text{rounded}\left(\frac{1}{N}\sum_{k=1}^{N} Nb(|E_k|)\right)$$

is then selected, whose final term is the mean size (in bit) of the prediction errors (in absolute value). This mean value is partly heuristic. It gave the optimum parameter in 95% of the cases tested, and otherwise a value differing by one unit. This estimator is calculated "in dribs and drabs", as the errors occur.

Advantages

This coding algorithm has the following advantages:

compression performances: the tests carried out on onshore data (dynamite) produce, with equal prediction orders, better results than those of the other methods tested, and especially more stable, with compression rates ranging between 50 and 70% (on average around 60%). For data acquired on the open sea (air guns), the performances are slightly better than those obtained with other methods, with rates ranging between 65 and 90%. Furthermore, the algorithm selected has a lower variability on a given shot: the difference between the extreme compression rates remains relatively small;

ease of execution: few external parameters need to be adjusted;

ease of coding and decoding: it is sufficient to transmit the error to exactly reconstitute the seismic trace, whereas the rival algorithms often require specific coding and transmission of the prediction coefficients; the data transmitted are homogeneous;

the decoding algorithm is nearly identical to the coding algorithm, which simplifies its implementation, and both work "in dribs and drabs" on the arrival of samples;

the modelling algorithm stages are simple and routine, and the coding results do not require much storage space;

the algorithm produces its own error coding parameters, so that it is not necessary to perform costly optimization iterations at this stage.

Results

For ten "shots" leading each to about a hundred traces during two seismic acquisition runs, performed with explosives (onshore) and air guns (offshore), each trace comprising 3000 to 4000 samples, the following results (prediction order 8) were obtained:

|  | Mean rate | Min./max. | Standard deviation |
| --- | --- | --- | --- |
| Onshore | 61 | 49/71 | 6.5 |
| Offshore | 75 | 65/90 | 8 |

A coding method has been described with a single threshold. Coding with several distinct threshold values codable respectively by several words of fixed size with evaluation of the word size sufficient for coding the prediction residues every minute can of course be selected without departing from the scope of the invention.

In order to improve the results, it is also possible for example:

a) to increase the prediction order (up to 15 for example);

b) to refine the error coding method by coding separately the least significant bits (from 1 to 4) and the most significant bits of the signal.

FIG. 5 is a flowchart of a method 100 of loss-free transmission of seismic signals having a wide dynamic range. The method begins with step 102 of sampling seismic signals and providing digitized samples of the seismic signals. The method proceeds from step 102 to step 104 where compressing the samples using a predictive coding technique to provide prediction coefficients and prediction residues occurs. The method proceeds from step 104 to step 106 where determining an estimation factor corresponding to a mean value $\hat{S}$ obtained from the position of respective most significant bits of the binary words coding the prediction residues, by a statistical evaluation of bits of the binary words of the prediction residues. The method proceeds from step 106 to step 108 where deducing at least one optimum threshold value which defines an amplitude range containing a determined amount of the prediction residues. The method proceeds from step 108 to step 110 where coding of the prediction residues in the amplitude: range by binary words of a number of bits dependent on the mean values $\hat{S}$ occurs, The method proceeds from step 110 to step 112 where coding the prediction residues which have an amplitude outside the amplitude range, with a determined number of bits greater than the number of bits used to code the prediction residues having amplitude within the amplitude range occurs. The method proceeds from step 112 to step 114 where transmitting only the prediction residues occurs.

What is claimed is:

1. A method of loss-free transmission of seismic signals having a dynamic range comprising:

sampling the seismic signals and providing digitized samples of the seismic signals;

compressing the digitized samples using a predictive coding technique to provide prediction coefficients and prediction residues, the prediction residues comprising binary words;

determining an estimation factor corresponding to a mean value Ŝ obtained from the position of respective most significant bits of the binary words coding the prediction residues, by a statistical evaluation of bits of the binary words of the prediction residues, and deducing at least one optimum threshold value which defines an amplitude range containing a determined amount of the prediction residues;

coding the prediction residues in the amplitude range by binary words of a number of bits dependent on the mean value Ŝ;

coding the prediction residues, which have an amplitude outside the amplitude range, with a determined number of bits greater than the number of bits used to code the prediction residues having amplitude within the amplitude range; and transmitting only the prediction residues.

2. A method as claimed in claim 1, comprising:

determining the amplitude range depending on a threshold value.

3. A method as claimed in claim 1, comprising:

separately coding least significant bits and most significant bits of samples of the seismic signals.

4. A method as claimed in claim 2, comprising:

separately coding least significant bits and most significant bits of samples of the seismic signals.

5. A method as claimed in claim 1, comprising:

determining the prediction residues for each new signal sample of the seismic signals.

6. A method as claimed in claim 2, comprising:

determining the prediction residues for each new signal sample of the seismic signals.

7. A method as claimed in claim 3, comprising;

determining the prediction residues for each new signal sample of the seismic signals.

8. A method as claimed in claim 4, comprising:

determining the prediction residues for each new signal sample of the seismic signals.

9. A method in accordance with claim 1 wherein:

the number of bits used for coding the prediction residues which have an amplitude outside the amplitude range is fixed.

10. A method in accordance with claim 2 wherein:

the number of bits used for coding the prediction residues which have an amplitude outside the amplitude range is fixed.

11. A method in accordance with claim 3 wherein:

the number of bits used for coding the prediction residues which have an amplitude outside the amplitude range is fixed.

12. A method in accordance with claim 4 wherein:

the number of bits used for coding the prediction residues which have an amplitude outside the amplitude range is fixed.

13. A method in accordance with claim 5 wherein:

the number of bits used for coding the prediction residues which have an amplitude outside the amplitude range is fixed.

14. A method in accordance with claim 6 wherein:

the number of bits used for coding the prediction residues which have an amplitude outside the amplitude range is fixed.

15. A method in accordance with claim 7 wherein:

the number of bits used for coding the prediction residues which have an amplitude outside the amplitude range is fixed.

16. A method in accordance with claim 8 wherein:

the number of bits used for coding the prediction residues which have an amplitude outside the amplitude range is fixed.

17. A method in accordance with claim 1 wherein:

the dynamic range is a wide dynamic range and the determined amount is most of the prediction residues.

18. A method in accordance with claim 2 wherein:

the dynamic range is a wide dynamic range and the determined amount is most of the prediction residues.

19. A method in accordance with claim 3 wherein:

the dynamic range is a wide dynamic range and the determined amount is most of the prediction residues.

20. A method in accordance with claim 4 wherein:

the dynamic range is a wide dynamic range and the determined amount is most of the prediction residues.

21. A method in accordance with claim 5 wherein:

the dynamic range is a wide dynamic range and the determined amount is most of the prediction residues.

22. A method in accordance with claim 6 wherein:

the dynamic range is a wide dynamic range and the determined amount is most of the prediction residues.

23. A method in accordance with claim 7 wherein:

the dynamic range is a wide dynamic range and the determined amount is most of the prediction residues.

24. A method in accordance with claim 8 wherein:

the dynamic range is a wide dynamic range and the determined amount is most of the prediction residues.

25. A method in accordance with claim 9 wherein:

the dynamic range is a wide dynamic range and the determined amount is most of the prediction residues.

26. A method in accordance with claim 10 wherein:

the dynamic range is a wide dynamic range and the determined amount is most of the prediction residues.

27. A method in accordance with claim 11 wherein:

the dynamic range is a wide dynamic range and the determined amount is most of the prediction residues.

28. A method in accordance with claim 12 wherein:

the dynamic range is a wide dynamic range and the determined amount is most of the prediction residues.

29. A method in accordance with claim 13 wherein:

the dynamic range is a wide dynamic range and the determined amount is most of the prediction residues.

30. A method in accordance with claim 14 wherein:

the dynamic range is a wide dynamic range and the determined amount is most of the prediction residues.

31. A method in accordance with claim 15 wherein:

the dynamic range is a wide dynamic range and the determined amount is most of the prediction residues.

32. A method in accordance with claim 16 wherein:

the dynamic range is a wide dynamic range and the determined amount is most of the prediction residues.

* * * * *